(12) United States Patent
Luh

(10) Patent No.: US 7,719,350 B1
(45) Date of Patent: May 18, 2010

(54) BANDPASS SAMPLE-AND-HOLD CIRCUIT

(75) Inventor: Louis Luh, Sunnyvale, CA (US)

(73) Assignee: HRL Laboratories, LLC, Malibu, CA (US)

( * ) Notice: Subject to any disclaimer, the term of this patent is extended or adjusted under 35 U.S.C. 154(b) by 58 days.

(21) Appl. No.: 11/875,472

(22) Filed: Oct. 19, 2007

(51) Int. Cl.
*H03B 1/10* (2006.01)
*H03K 5/00* (2006.01)
*H04B 1/10* (2006.01)

(52) U.S. Cl. ...................................... 327/557

(58) Field of Classification Search .......... 327/551–559
See application file for complete search history.

(56) References Cited

U.S. PATENT DOCUMENTS

| 6,983,136 B2* | 1/2006 | Mason et al. ................ 455/307 |
| 2006/0040628 A1* | 2/2006 | Porret et al. ............. 455/234.1 |
| 2008/0122529 A1* | 5/2008 | Bagheri et al. ............... 327/552 |

* cited by examiner

*Primary Examiner*—Quan Tra
(74) *Attorney, Agent, or Firm*—Ladas & Parry

(57) ABSTRACT

A sample-and-hold circuit includes a transconductance cell and an inductive-capacitive (L-C) resonator circuit acting as a bandpass filter.

20 Claims, 2 Drawing Sheets

PRIOR ART

BANDPASS SAMPLE-AND-HOLD CIRCUIT

TECHNICAL FIELD

This disclosure relates to sample-and-hold circuits and more particularly to a new concept for a bandpass sample-and-hold circuit utilizing a transconductance cell and an inductor.

BACKGROUND

Bandpass sample-and-hold circuits are modern low-cost, high-performance solutions for directly sampling an RF signal and are often found in the front end of direct-sampling RF analog-to-digital converters (ADCs) to hold the signal steady during the conversion period for the ADC to process. Thus, many communication systems employ such circuits, including but not limited to commercial wireless communication systems.

To directly digitize a high-frequency RF signal, one solution is to use high-speed sample-and-hold circuits, which are able to track the fast-changing signal during the track period as well as to hold the sampled signal long enough during the hold period. Conventional sample-and-hold circuits are wideband sample-and-hold circuits that pass through all the signals, from DC all the way to the frequencies of interest. They not only collect all out-of-band interference but also self-generated circuit noise (including, e.g., white noise, flicker noise, shot noise, etc). When the frequencies of interest are high, the self-generated circuit noise will adversely impact the signal-to-noise ratio (SNR) of the circuit and thus limit its sample-and-hold resolution. Furthermore, to maintain the voltage gain and linearity for wide bandwidths, typical sample-and-hold circuits have to use significant power.

FIG. 1 is a schematic depiction of a typical sample-and-hold (also referred to in the art as track-and-hold) circuit architecture 100 commonly used in high-speed, wide-bandwidth applications that employs transconductance cells (or Gm-Cells) 110 that converts an input voltage to current. The skilled reader will recognize this as an open-loop track-and-hold circuit with hold signal feedback to isolate the input signal feed-through. The input signal or input voltage $V_{in}$ is first converted into current $I_{in}$ by a first transconductance cell 110, which is then fed through a first switch 112 and converted back to a voltage $V_m$ by a resistor 114 having a resistance value of R. The converted voltage $V_m$ is sampled by a second switch 116 and accumulated by a capacitor 118 having a capacitance value of C. The signal accumulated in capacitor 118 is buffered by a unity-gain amplifier/buffer 120 and subsequently fed as output voltage $V_{out}$. A second Gm cell 130 is connected between the buffered output of the buffer 120 and the first switch 112 to stabilize the accumulated signal during the circuit's HOLD mode (i.e. while the converted voltage $V_m$ is not being accumulated). The use of the second Gm cell 130 also decouples the leak-through noise from the input caused by the parasitic capacitance present in the second switch 116.

In this circuit architecture the voltage gain of the circuit is defined by the transconductance gain of the first Gm cell 110 and the resistance value R of the resistor 114. The bandwidth is determined by R, C and the bias current of the second switch 116. To present a wider operational bandwidth, R and C need to be reduced. However, a small R value will produce a small converted voltage $V_m$ and therefore will necessitate a higher transconductance gain from the first Gm cell 110 to compensate, which in turn will lead to higher overall power consumption by the circuit. On the other hand, a low value of C will cause more KT/C switching noise and also a worse droop rate because the signal $V_m$ cannot be held steady, thereby causing error. Conversely, a higher value of C will require a higher bias current for the second switch 116 to charge, to discharge, and to minimize signal distortion. Thus, to sample and hold very high frequency, this circuit architecture requires comparatively large amounts of power.

In addition to less-than-optimal power consumption, this wideband sample-and-hold circuit architecture also presents excessive noise collection because it collects all out-of-band interference along with the self-generated circuit noise (white, flicker, shot noise, etc), leading to the reduced SNR performance and attendant limited resolution previously mentioned.

What is now needed is an improved archotecture for wideband sample-and-hold circuits that offer improved SNR performance and higher sampling resolution. The embodiments of the present disclosure answer these and other needs.

SUMMARY

In a first embodiment disclosed herein a circuit comprises a transconductance cell disposed to receive an input signal and generate a corresponding output signal; an inductive-capacitive (L-C) resonator circuit connected to the transconductance cell to sample the output signal of the transconductance cell and attenuate predetermined frequencies in the sampled signal; and an amplifier connected to buffer the sampled signal and provide the buffered sampled signal at an output.

In another embodiment disclosed herein, a method of sampling a signal comprises disposing a transconductance cell to receive an input signal and generate a corresponding output signal; connecting an inductive-capacitive (L-C) resonator circuit to the transconductance cell to sample the output signal of the transconductance cell and attenuate predetermined frequencies in the sampled signal; and connecting an amplifier to buffer the sampled signal and provide the buffered sampled signal at an output.

In a further embodiment disclosed herein, the resonator circuit comprises a capacitor and an inductor connected in parallel with the capacitor between the output of the transconductance cell and ground.

In still further embodiments disclosed herein, the resonator circuit comprises a sampling switch connected to selectively feed the transconductance cell output signal to the resonator or to ground.

These and other features and advantages will become further apparent from the detailed description and accompanying figures that follow. In the figures and description, numerals indicate the various features, like numerals referring to like features throughout both the drawings and the description.

DETAILED DESCRIPTION

An embodiment of sample-and-hold circuit as disclosed herein uses an inductor-capacitor (L-C) resonator to attenuate the out-of-band signal and uses the associated capacitor to hold the input information for the sample-and-hold circuit. The bandpass property of the L-C resonator attenuates the out-of-band interference as well as the self-generated circuit noise (white, flicker, shot noise, etc), which effectively improves the signal-to-noise ratio (SNR) of the sample-and-hold circuit. The L-C resonator also offers improved voltage gain for the input signal, which further improves the signal-to-noise ratio and reduces overall circuit power consumption.

Figure 1:
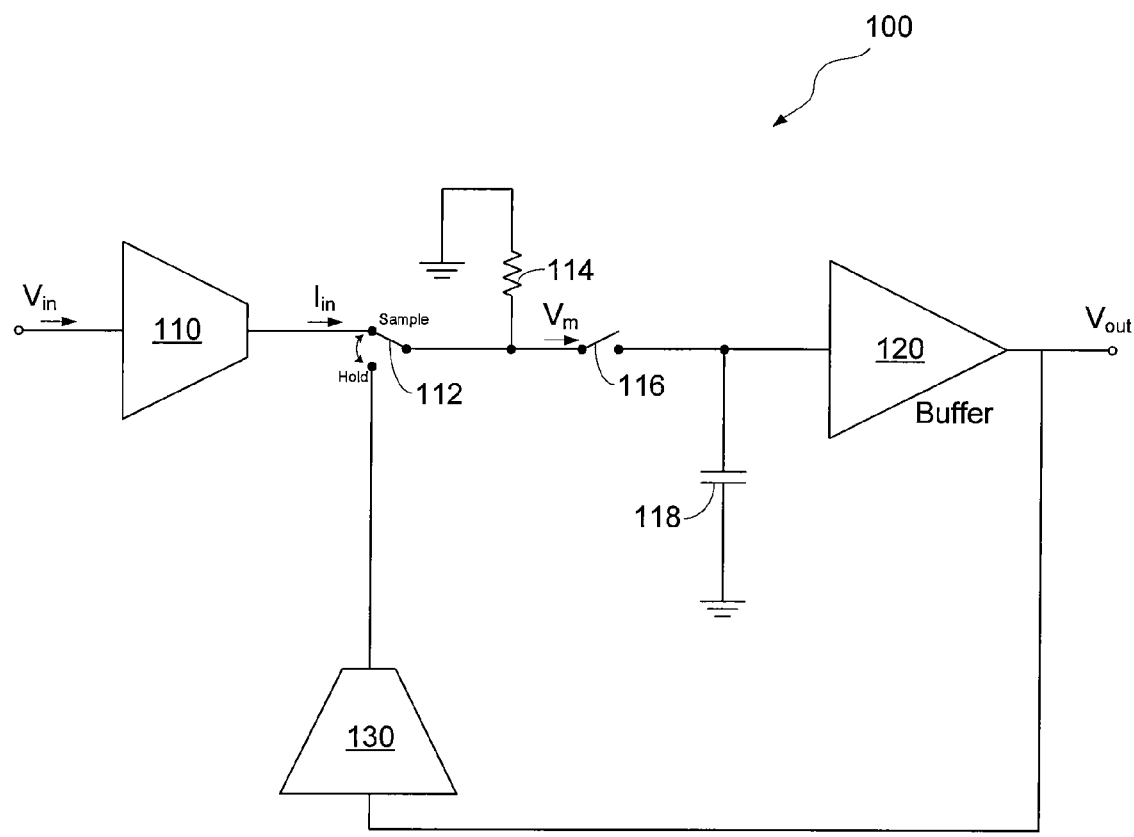
FIG. 1 is a schematic depiction of a typical sample-and-hold (also referred to in the art as track-and-hold) circuit architecture as known in the art.
Figure 2:
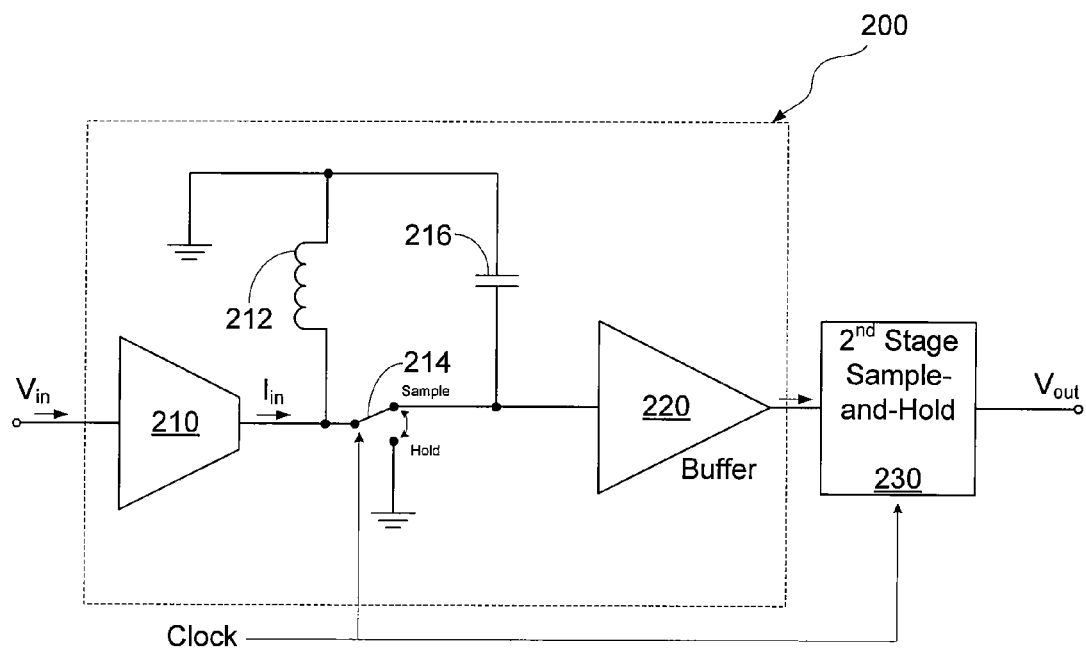
FIG. 2 is schematic depiction of a novel sample-and-hold circuit architecture according to the present disclosure.

With reference to FIG. 2, an embodiment of a bandpass sample-and-hold circuit 200 according to the present disclosure includes a Gm cell 210 that receives the continuous-time input signal to be sampled and converts it from voltage $V_{in}$ into current $I_{in}$, which is then fed to an inductor 212 having an inductance value of L. During the sample mode of the circuit (illustrated in FIG. 2), the inductor 212 is shorted through a switch 214 to a capacitor 216 having a capacitance value of C. The L-C combination of the inductor 212 and the capacitor 216 forms a L-C resonator that, when connected in this configuration, functions as a bandpass filter and attenuates out-of-band signals and offers voltage gain to the in-band signals.

As shown in FIG. 2, during the hold cycle the switch 214 shorts the inductor 212 to ground, and thereby resets the inductor to prepare it for the next sample cycle. During the hold cycle (that is, while the switch 214 is disconnected from the capacitor 216 and is connected to ground) the sampled signal is accumulated by the capacitor 216. The accumulated signal is then buffered by a unity-gain amplifier/buffer 220 to drive the next stage 230, which is typically another sample-and-hold circuit that has a smaller operating bandwidth. A common clock signal preferably drives both circuit 200 by actuating the switch 214 as well as the second stage 230.

In circuit 200, the voltage gain is defined by the transconductance gain of Gm cell 210 and the impedance L of the L-C resonator (functioning as bandpass filter) combination of the inductor 212 and the capacitor 216. In the pass band of this L-C bandpass filter, the impedance L is very high as it depends on the Q-factor of the inductor. Therefore, sample-and-hold circuit 200 can achieve high voltage gain without the use of a high-gain Gm cell. This property relaxes the linearity and power consumption requirements for the input Gm cell and leads to reduced power consumption and sampled signal distortion. The holding capacitor 216 for the circuit may be larger to reduce the KT/C thermal noise and the droop rate by reducing the inductance L required of the inductor 212.

The L-C bandpass filter may be designed to only pass the frequency band of interest and reject the out-of-band interference and circuit noise. Because the capacitance C of the capacitor 216 may be larger, the bandpass filter my be designed to offer reduced droop rate and hence may employ a slower (narrower bandwidth) output buffer 220 to buffer the sample-and-hold output. Use of such a narrower bandwidth output buffer 220 will serve to further reduce the circuit noise and improve the signal-to-noise ratio of the circuit 200.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . "

What is claimed is:

1. A circuit, comprising:
    a transconductance cell having an input terminal and an output terminal, the transconductance cell disposed to receive an input signal at the input terminal and generate a corresponding output signal at the output terminal;
    an inductive-capacitive (L-C) resonator circuit connected to the transconductance cell to sample the output signal of the transconductance cell and attenuate predetermined frequencies in the sampled signal, the resonator circuit including an inductor positioned to be electronically coupled with the output terminal of the transconductance cell during both a sample cycle and a hold cycle of the resonator circuit; and
    an amplifier connected to buffer the sampled signal and provide the buffered sampled signal at an output.

2. The circuit of claim 1, wherein the amplifier is a unity-gain amplifier.

3. The circuit of claim 1, wherein the resonator circuit comprises:
    a capacitor, the inductor being connected in parallel with the capacitor between the output terminal of the transconductance cell and ground.

4. The circuit of claim 3, wherein the resonator circuit comprises:
    a sampling switch connected to selectively feed the transconductance cell output signal to the resonator or to ground.

5. The circuit of claim 4, wherein the sampling switch is connected between a terminal of the inductor and a terminal of the capacitor.

6. The circuit of claim 5, wherein the amplifier is a unity-gain amplifier.

7. A circuit, comprising:
    a first circuit according to claim 1; and
    a second circuit according to claim 1 connected to receive the output signal of the first circuit and to attenuate predetermined frequencies in the received signal that are in a narrower range of frequencies than the range of frequencies attenuated by the first circuit.

8. The circuit of claim 7, wherein the first circuit and the second circuit are connected to be actuated by a common clock signal.

9. A method of sampling a signal, comprising:
selecting a transconductance cell having an input terminal and an output terminal;
disposing the transconductance cell to receive an input signal at the input terminal and generate a corresponding output signal at the output terminal;
connecting an inductive-capacitive (L-C) resonator circuit that includes an inductor to the transconductance cell to sample the output signal of the transconductance cell and attenuate predetermined frequencies in the sampled signal;
positioning the inductor to be electronically coupled with the output terminal of the transconductance cell during both a sample cycle and a hold cycle of the resonator circuit; and
connecting an amplifier to buffer the sampled signal and provide the buffered sampled signal at an output.

10. The method of claim 9, wherein the amplifier is a unity-gain amplifier.

11. The method of claim 9, wherein the resonator circuit comprises:
a capacitor, the inductor being connected in parallel with the capacitor between the output terminal of the transconductance cell and ground.

12. The method of claim 11, wherein connecting the resonator comprises:
connecting a sampling switch to selectively feed the transconductance cell output signal to the resonator or to ground.

13. The method of claim 12, wherein connecting a sampling switch comprises connecting the sampling switch between a terminal of the inductor and a terminal of the capacitor.

14. The method of claim 13, wherein the amplifier is a unity-gain amplifier.

15. A method, comprising:
sampling a signal according to claim 9 to produce a first sampled signal; and
sampling the first sampled signal according to claim 9 so as to attenuate predetermined frequencies in the first sampled signal that are in a narrower range of frequencies than the range of frequencies attenuated by the first circuit.

16. The method of claim 15, wherein the sampling of the signal and the sampling of the first sampled signal are driven by a common clock signal.

17. The circuit of claim 1, wherein the amplifier has an amplifier input terminal and the inductor has an inductor input terminal, the circuit comprising:
a sampling switch electronically disposed between the inductor and the amplifier, the sampling switch positioned to short the inductor input terminal with the amplifier input terminal during the sample cycle and/or isolate the inductor input terminal from the amplifier input terminal during the hold cycle.

18. The circuit of claim 1, wherein the inductor has an inductor input terminal, the circuit comprising:
a sampling switch positioned to ground the inductor input terminal.

19. The method of claim 9, comprising:
selecting an amplifier input terminal for the amplifier and an inductor input terminal for the inductor;
shorting the inductor input terminal with the amplifier input terminal during the sample cycle; and
isolating the inductor input terminal from the amplifier input terminal during the hold cycle.

20. The method of claim 9, comprising:
selecting an inductor input terminal and an inductor output terminal for the inductor; and
shorting the inductor input and output terminals to ground during the hold cycle.

* * * * *